(12) United States Patent
Taninaka et al.

(10) Patent No.: US 7,847,304 B2
(45) Date of Patent: Dec. 7, 2010

(54) LED ARRAY, LED HEAD AND IMAGE RECORDING APPARATUS

(75) Inventors: Masumi Taninaka, Hachioji (JP); Masumi Koizumi, Hachioji (JP); Hiroshi Hamano, Hachioji (JP)

(73) Assignee: Oki Data Corporation, Tokyo (JP)

( * ) Notice: Subject to any disclaimer, the term of this patent is extended or adjusted under 35 U.S.C. 154(b) by 84 days.

(21) Appl. No.: 11/692,249

(22) Filed: Mar. 28, 2007

(65) Prior Publication Data

US 2007/0228397 A1 Oct. 4, 2007

(30) Foreign Application Priority Data

Mar. 31, 2006  (JP) .............................. 2006-100720

(51) Int. Cl.
*H01L 29/201* (2006.01)
(52) U.S. Cl. .............................. 257/90; 257/89; 257/96; 257/97; 257/E25.02; 257/E33.005; 438/35
(58) Field of Classification Search .................. 257/90, 257/89, E25.02, E25.032, E25.021, 96, 97, 257/E33.005; 438/35
See application file for complete search history.

(56) References Cited

U.S. PATENT DOCUMENTS

| | | | |
|---|---|---|---|
| 4,700,206 A * | 10/1987 | Yamakawa | 347/238 |
| 5,424,560 A * | 6/1995 | Norman et al. | 257/40 |
| 6,337,492 B1 * | 1/2002 | Jones et al. | 257/40 |
| 6,424,093 B1 * | 7/2002 | Mir et al. | 315/169.3 |
| 2004/0183089 A1* | 9/2004 | Udagawa | 257/103 |
| 2004/0222433 A1* | 11/2004 | Mazzochette et al. | 257/99 |
| 2004/0262617 A1* | 12/2004 | Hahm et al. | 257/79 |
| 2005/0082543 A1* | 4/2005 | Alizadeh et al. | 257/79 |
| 2006/0152150 A1* | 7/2006 | Boerner et al. | 313/506 |

FOREIGN PATENT DOCUMENTS

JP  08-064862  3/1996

\* cited by examiner

*Primary Examiner*—Thanh V Pham
*Assistant Examiner*—Maria Ligai
(74) *Attorney, Agent, or Firm*—Rabin & Berdo, PC

(57) ABSTRACT

An LED array includes a semiconductor substrate and a plurality of first LED portions formed integrally on a surface of the semiconductor substrate. The first LED portions emit light of a predetermined color. The LED array includes a plurality of second LED portions fixed to the semiconductor substrate and are disposed corresponding to the first LED portions. The second LED portions emit light whose color is different from the first LED portions. The second LED portions are so disposed that active layers of the second LED portions are substantially at the same height as active layers of the first LED portions.

11 Claims, 17 Drawing Sheets

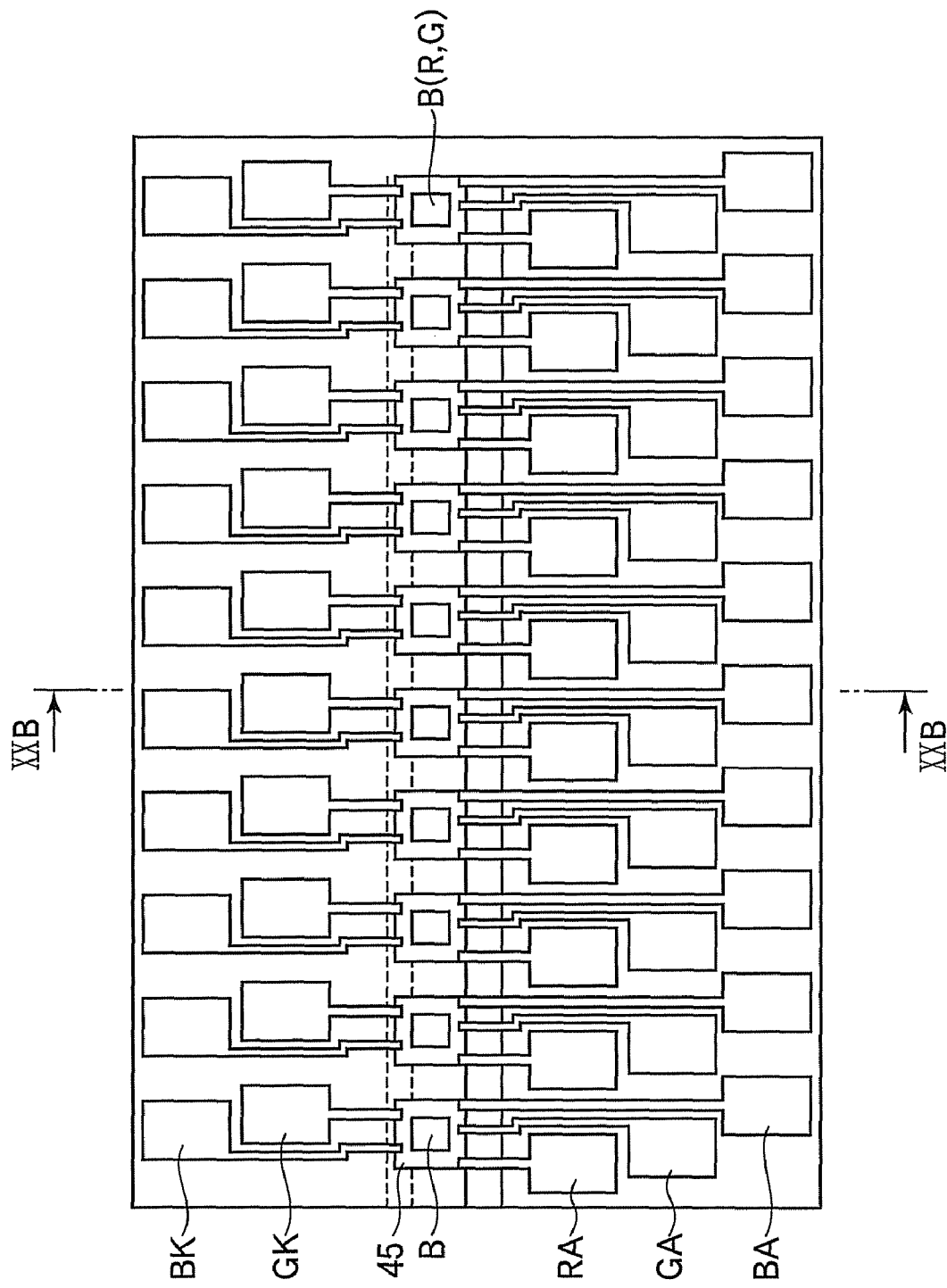

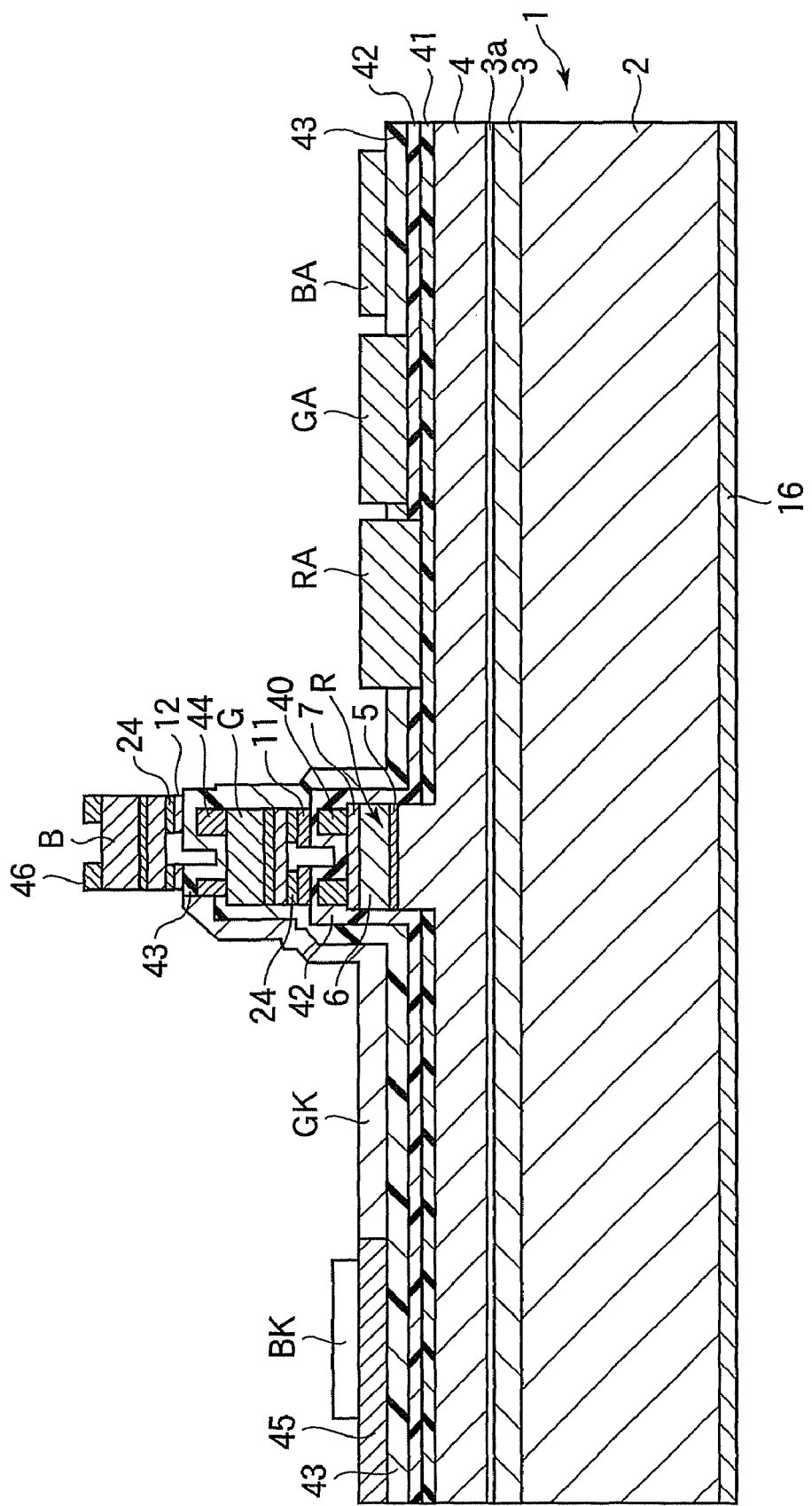

LED ARRAY, LED HEAD AND IMAGE RECORDING APPARATUS

BACKGROUND OF THE INVENTION

This invention relates to an LED (Light Emitting Diode) array, an LED head using the LED array, and an image recording apparatus using the LED head.

An LED (Light Emitting Diode) is used in various ways as a light source for an illumination or a display, or a light source for writing information on a recording medium. For example, an electrophotographic printer uses an LED head including a plurality of LED arrays. Each LED array includes LEDs that emit red (i.e., a single color) light arranged along a plurality of rows in a scanning direction. The image recording apparatus is configured to control the LED head to expose a photosensitive body, and superimpose toner images of a plurality of colors on a recording sheet, so that a color image is formed on the recording sheet.

Further, there is known an image recording apparatus that directly irradiates a photosensitive film or a photosensitive sheet with lights of a plurality of colors. For example, such an image recording apparatus is configured to receive a memory card storing digital image data (obtained by a digital camera or the like) inserted therein. Further, the image date is supplied to the LED head including a multicolor LED array that emits lights of a plurality of colors. In accordance with the image data, the multicolor LED array emits lights of the respective colors on the photosensitive sheet or the like.

An example of a conventional multicolor LED array that emit lights of a plurality of colors is disclosed in, for example, Japanese Laid-Open Patent Publication No. 8-64862 (i.e., U.S. Pat. No. 5,424,560). The LED array disclosed in the publication has a structure including a red LED organic layer patterned on an electron transport layer, a green LED organic layer covering the red LED organic layer and the electron transport layer, and a blue LED organic layer covering the green LED organic layer and the electron transport layer. Transparent electrodes are formed above contact portions where the respective LED organic layers contact the surface of the electron transport layer. Red, green and blue lights are emitted from the contact portions where the respective LED organic layers contact the surface of the electron transport layer. Therefore, the light emitting positions of the respective colors are different from one another in height.

Since the light emitting positions of the respective colors are different from one another in height, the distances from the respective light emitting positions to the surface of the photosensitive material (such as a photosensitive sheet) are different from one another. Thus, it is difficult to focus all of the lights of the respective colors on the surface of the photosensitive material, and therefore it is difficult to form a sharp image.

SUMMARY OF THE INVENTION

An object of the present invention is to provide an LED array, an LED head and an image recording apparatus capable of enhancing sharpness of an image.

The present invention provides an LED array including a semiconductor substrate and a plurality of first LED portions formed integrally on a surface of the semiconductor substrate. The first LED portions emit light of a predetermined color. The LED array further includes a plurality of second LED portions fixed to the semiconductor substrate and disposed corresponding to the first LED portions. The second LED portions emit light whose color is different from the first LED portions. The second LED portions are so disposed that active layers of the second LED portions are substantially at the same height as active layers of the first LED portions.

Since the first LED portions (that emit light of a predetermined color) are formed on the semiconductor substrate, and the second LED portions (that emit light of different color) are fixed to the semiconductor substrate in such a manner that the active layers of the first and second LED portions are substantially at the same height, the distances from the respective LED portions to a photosensitive material can be the same as one another. Therefore, it becomes possible to form a sharp image.

The present invention also provides an LED array including a semiconductor substrate and a plurality of first LED portions formed integrally on a surface of the semiconductor substrate. The first LED portions emit light of a predetermined color. The LED array further includes a plurality of second LED portions respectively layered on the first LED portions. The second LED portions emit light whose color is different from the first LED portions. The second LED portions are in the form of thin films.

The present invention also provides an LED head including the LED array and a driving circuit that controls the first LED portions and the second LED portions in accordance with image data.

The present invention also provides an image recording apparatus including the LED head and a feeding portion that feeds a photosensitive material in an auxiliary scanning direction. The photosensitive material is exposed with lights of respective colors emitted by the LED head.

BRIEF DESCRIPTION OF THE DRAWINGS

In the attached drawings:

FIG. 20A is a plan view illustrating an LED array according to Embodiment 4 of the present invention;

FIG. 20B is a sectional view illustrating the LED array according to Embodiment 4, taken along line XXB-XXB shown in FIG. 20A.

DETAILED DESCRIPTION OF THE PREFERRED EMBODIMENT

Embodiments of the present invention will be described with reference to the attached drawings.

Embodiment 1

Figure 1A:
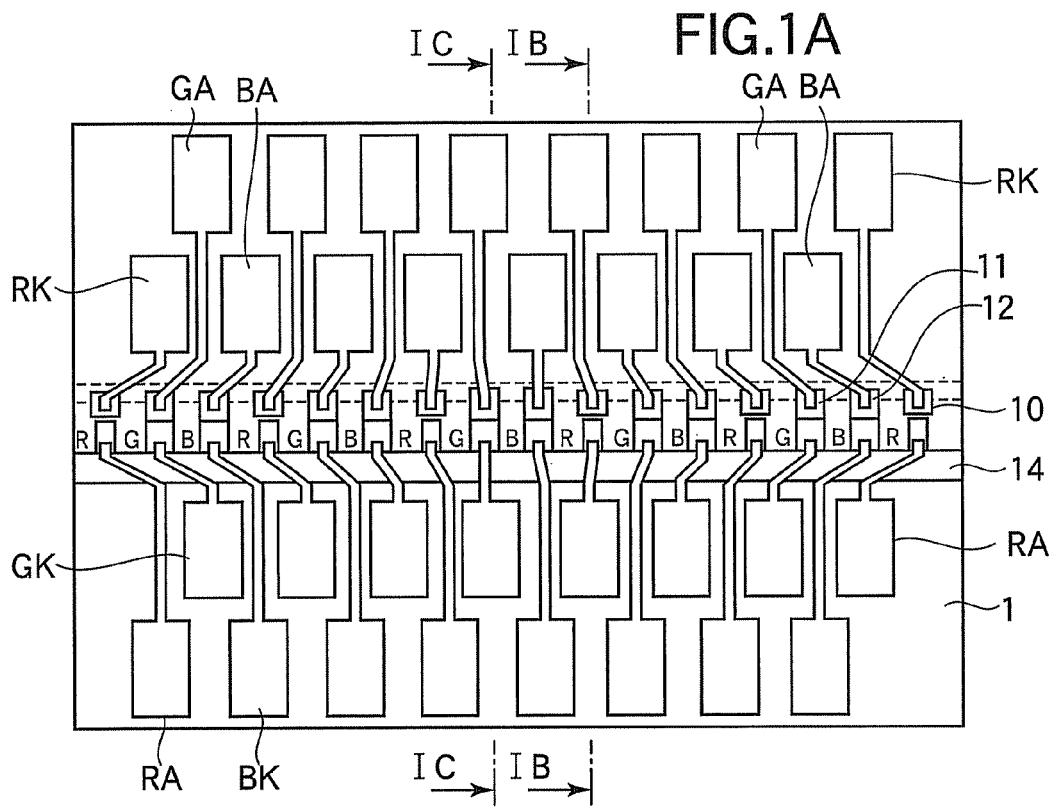
FIG. 1A is a plan view illustrating an LED array according to Embodiment 1 of the present invention.
Figure 1B:
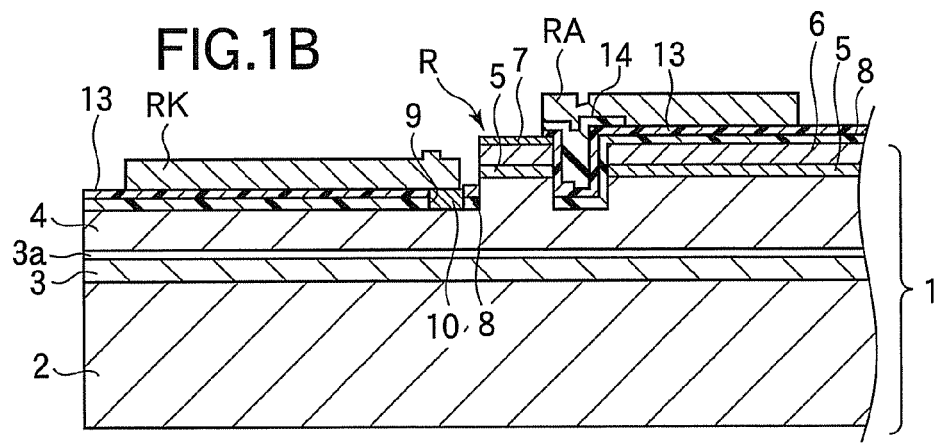
FIG. 1B is a sectional view illustrating a red LED portion of the LED array R, taken along line IB-IB in FIG. 1A.
Figure 1C:
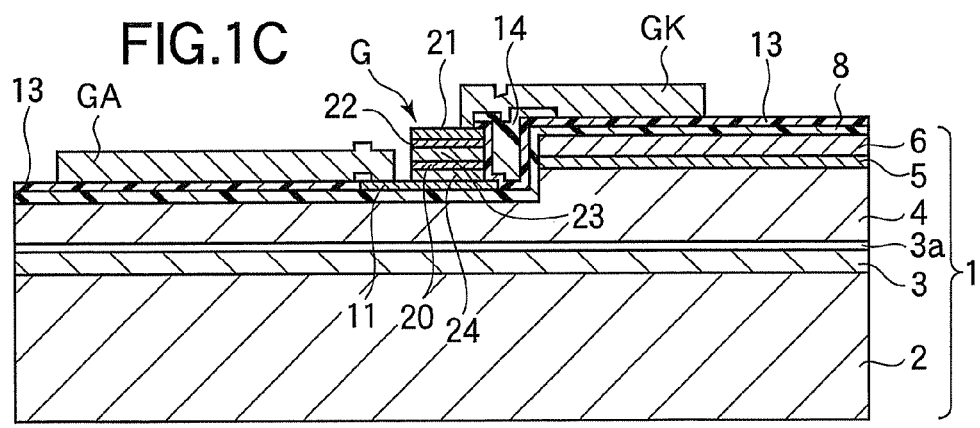
FIG. 1C is a sectional view illustrating a green LED portion of the LED array G, taken along line IC-IC in FIG. 1A.

FIG. 1A is a plan view illustrating an LED array according to Embodiment 1 of the present invention. FIG. 1B is a sectional view illustrating a red LED portion R of the LED array, taken along line IB-IB in FIG. 1A. FIG. 1C is a sectional view illustrating a green LED portion G of the LED array, taken along line IC-IC in FIG. 1A.

The LED array of Embodiment 1 of the present invention includes a semiconductor substrate 1 as shown in FIGS. 1B and 1C. The semiconductor substrate 1 includes a GaAs substrate 2 for emitting red light, a buffer layer 3 formed on the GaAs substrate 2, a p-type semiconductor layer 3a formed on the buffer layer 3, an n-type lower cladding layer 4 formed on the p-type semiconductor layer 3a, an active layer 5 formed on the n-type lower cladding layer 4 and an upper cladding layer 6 formed on the active layer 5. The lower cladding layer 4 is composed of InAlGaP or AlGaAs containing higher percentage of Al content than the active layer 5. The active layer 5 is composed of InAlGaP or AlGaAs. The upper cladding layer 6 is composed of InAlGaP or AlGaAs containing higher percentage of Al content than the active layer 5. A not shown contact layer (composed of GaP or GaAs) is formed on the upper cladding layer 6.

As shown in FIGS. 1A and 1B, a plurality of red LED portions R are formed on the semiconductor substrate 1 by means of an etching process. The red LED portions R are arranged at constant intervals in the longitudinal direction of the semiconductor substrate 1, i.e., in the main scanning direction.

Next, the manufacturing method of the red LED portions R will be described.

Figure 2A:
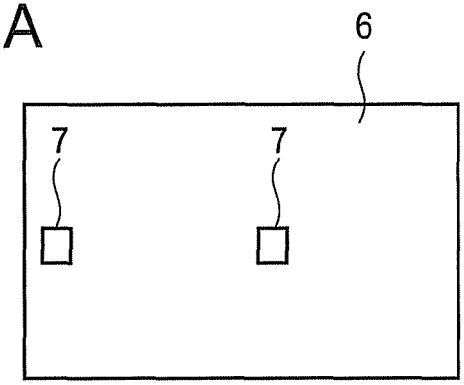
FIGS. 2A through 2D illustrate a manufacturing process of the red LED portions R according to Embodiment 1.

First, as shown in FIG. 2A, transparent electrodes 7 are formed on regions of the uppermost layer (i.e., the not shown contact layer on the upper cladding layer 6) of the semiconductor substrate 1 where the red LED portions R are to be formed. The transparent electrodes 7 are composed of, for example, ITO or ZnO. The transparent electrodes 7 can be formed using a lift-off method. Alternatively, the transparent electrodes 7 can be formed by coating a transparent electrode film and by etching the transparent electrode film using a photolithographic etching method. The transparent electrodes 7 are formed to have the thickness from 1000 to 5000 Å (100 to 500 nm). In this regard, although a large number of transparent electrodes 7 are formed at constant intervals, two of the transparent electrodes 7 are shown in FIGS. 2A thorough 2D.

Figure 2B:
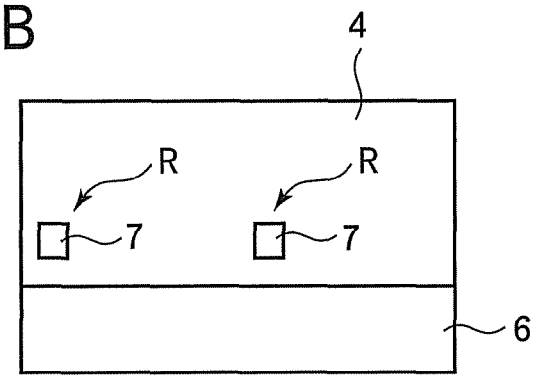

As shown in FIGS. 1B and 2B, an etching mask is formed on the transparent electrodes 7, and an etching process is performed using a dry etching process to a depth sufficient to remove the active layer 5 so that the lower cladding layer 4 is partially exposed in a stepwise fashion. With this, the red LED portions R are formed. In this process, it is preferable to perform the dry etching using an etching mask of $SiO_2$ and chlorine-based gas.

Figure 2C:
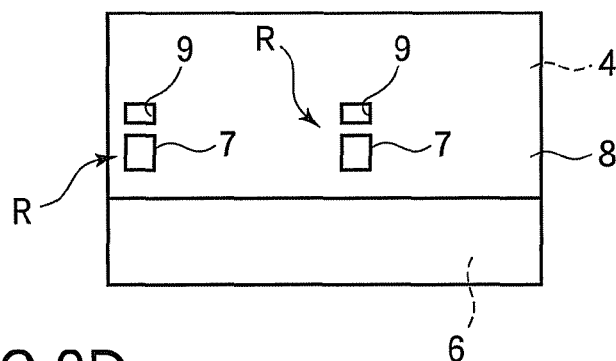

Next, as shown in FIGS. 1B and 2C, an insulation layer 8 is coated to cover the red LED portions R and the upper surface of the semiconductor substrate 1. Then, the portions of the insulation layer 8 above the red LED portions R and portions above the vicinity of the LED portions 8 are removed, so that the red LED portions R are exposed and openings 9 are formed. In this Embodiment, the insulation layer 8 is formed of SiN or $SiO_2$ and has the thickness from 200 to 3000 Å (20 to 300 nm), and the openings 9 are formed using the etching process.

Figure 2D:
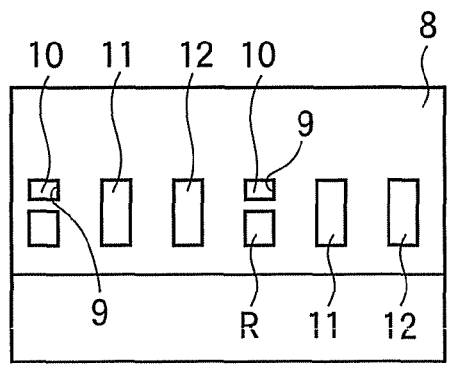

Next, as shown in FIGS. 1B and 2D, contact electrodes 10 are formed in the openings 9 so that the contact electrodes 10 contact the lower cladding layer 4. The contact electrodes 10 are formed of Ti having the thickness from 20 to 500 Å (2 to 50 nm) and AuGe having the thickness from 1000 to 5000 Å (100 to 500 nm).

Further, as shown in FIG. 2D, bonding electrodes 11 and 12 are formed on the insulation layer 8 between the adjacent red LED portions R. The bonding electrodes 11 and 12 can be formed of the same material as the contact electrodes 10 and can have the same thickness as the contact electrodes 10. In such a case, the respective electrodes 10, 11 and 12 can be formed at the same time.

Referring back to FIGS. 1A and 1C, the green LED portions G and the blue LED portions B are fixed to the semiconductor substrate 1 between the red LED portions R.

Here, the manufacturing process of the green LED portions G will be described with reference to FIGS. 3A through 3C.

Figure 3A:
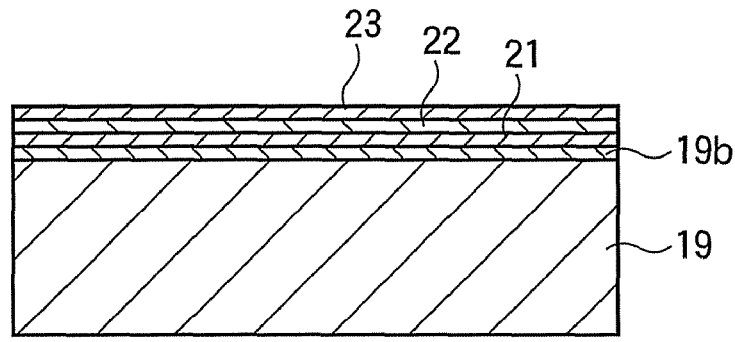
FIGS. 3A through 3C illustrate a manufacturing process of the green LED portions G according to Embodiment 1.
Figure 3B:
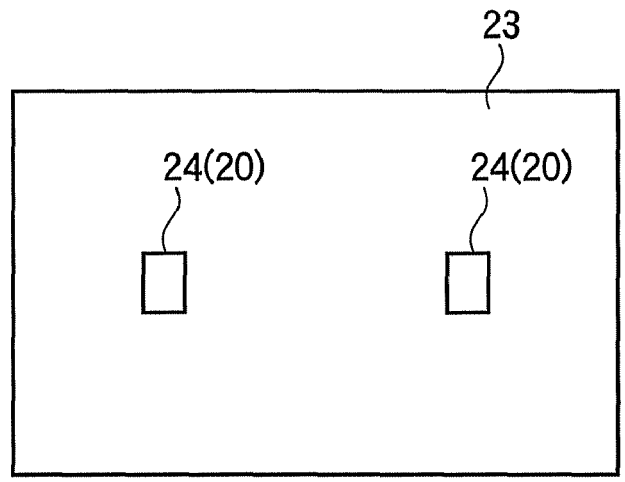
Figure 3C:
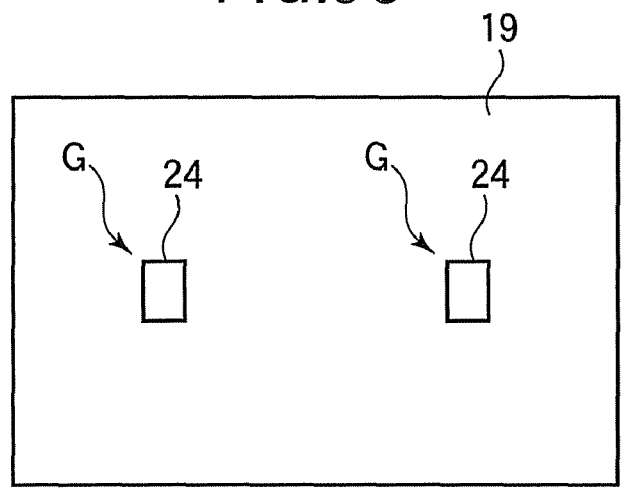

FIG. 3A is a sectional view and FIGS. 3B and 3C are plan views for illustrating the manufacturing process of the green LED portions G.

First, as shown in FIG. 3A, an n-type cladding layer 21 is formed on a sapphire substrate 19 via a buffer layer 19b. Then, an active layer 22 is formed on the n-type cladding layer 21, and a p-type cladding layer 23 is formed on the active layer 22. The n-type cladding layer 21 is formed of GaN, the active layer 22 is formed of InGaN, and the p-type cladding layer 23 is formed of GaN.

Next, as shown in FIG. 3B, transparent electrodes 20 are formed on regions of the p-type cladding layer 23 where green LED portions G are to be formed. Then, to-be-bonded electrodes 24 are formed on the transparent electrodes 20. The to-be-bonded electrodes 24 are formed of the same material as the bonding electrodes 11, and are formed of Ti having the thickness from 20 to 500 Å (2 to 50 nm) and AuGe having the thickness from 1000 to 5000 Å (100 to 500 nm).

Next, as shown in FIG. 3C, an etching mask is formed to cover the to-be-bonded electrodes 24. Then, an etching process is performed using the dry etching process to a depth sufficient to expose the sapphire substrate 19, so that the green LED portions G are formed. This etching process is performed using an etching mask of $SiO_2$ and chlorine-based gas.

Figure 4A:
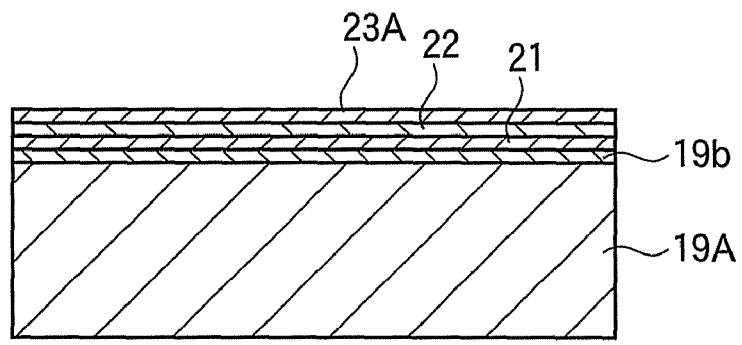
FIGS. 4A through 4C illustrate a manufacturing process of blue LED portions B according to Embodiment 1.
Figure 4B:
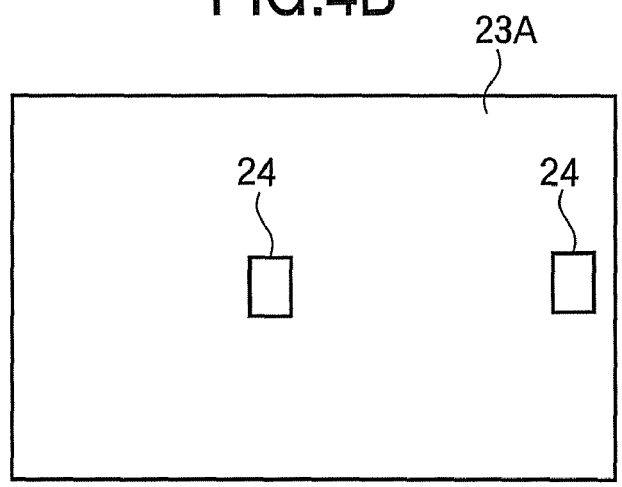
Figure 4C:
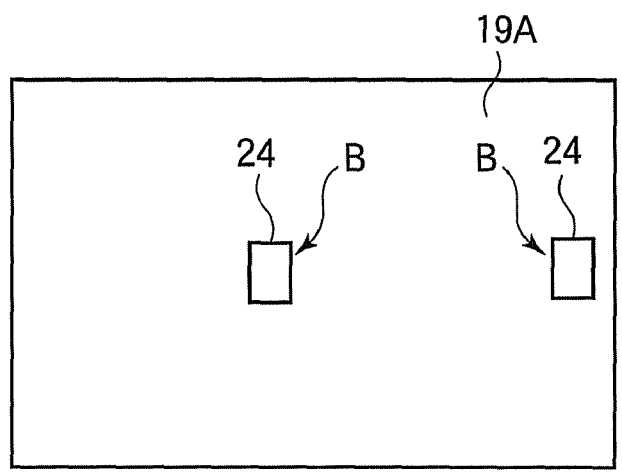

The LED portions B are formed in a similar manner to the green LED portion G. FIG. 4A is a sectional view and FIGS. 4B and 4C are plan views for illustrating the manufacturing process of the blue LED portions B.

As shown in FIG. 4A, an n-type cladding layer 21, an active layer 22 and a p-type cladding layer 23A are formed on a sapphire substrate 19A via a buffer layer 19b. Then, as shown in FIG. 4B, transparent electrodes 20 and to-be-bonded electrodes 24 are formed on regions of the p-type cladding layer 23A where blue LED portions B are to be formed. Next, as shown in FIG. 4C, an etching process is performed to a depth sufficient to expose the sapphire substrate 19A, so that the blue LED portions B are formed. The blue LED portions B are formed of GaN-based compound semiconductor, as the green LED portions G.

The LED portions G and B individually formed on the respective sapphire substrates 19 and 19A have the same height as the red LED portions R integrally formed on the semiconductor substrate 1.

Referring back to FIGS. 1A and 1C, the LED portions G and B are fixed to the bonding electrodes 11 and 12 provided on the semiconductor substrate 1.

Here, the fixing process of the LED portions G and B will be described.

Figure 5A:
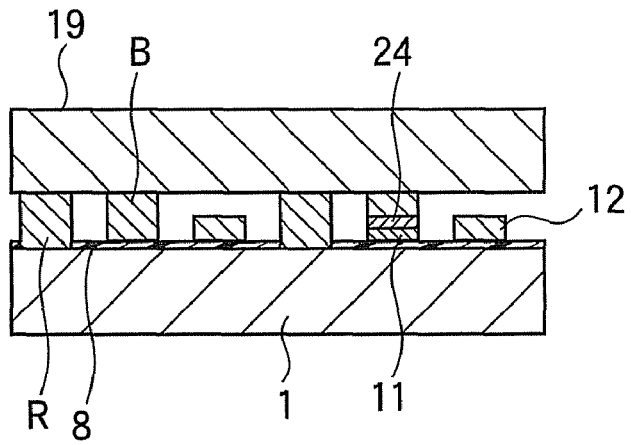
FIGS. 5A through 5C illustrate a fixing process of the green LED portions G according to Embodiment 1.
Figure 5B:
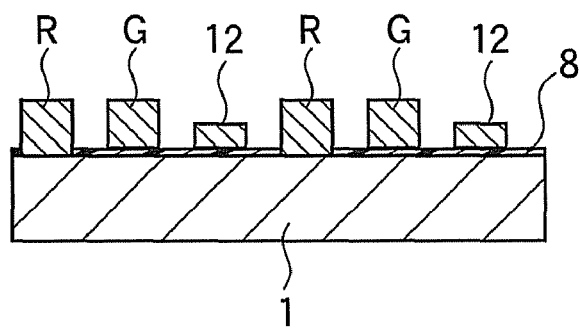
Figure 5C:
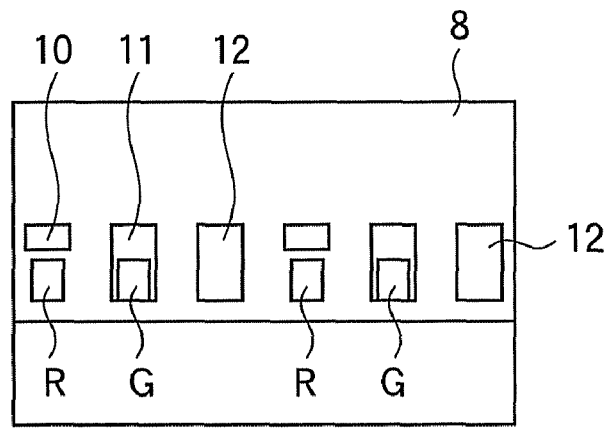
Figure 6A:
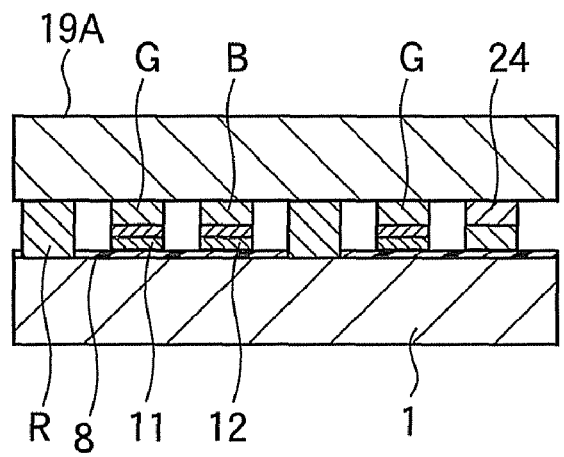
FIGS. 6A through 6C illustrate a fixing process of the blue LED portions B according to Embodiment 1.
Figure 6B:
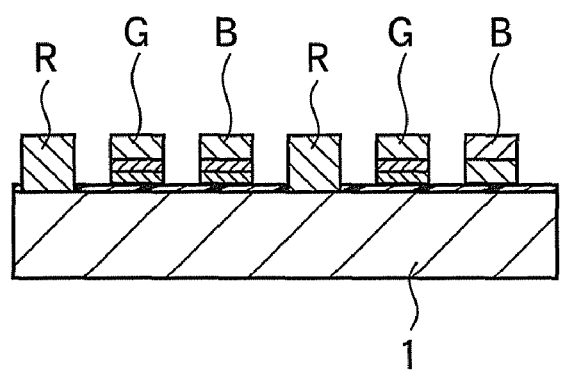
Figure 6C:
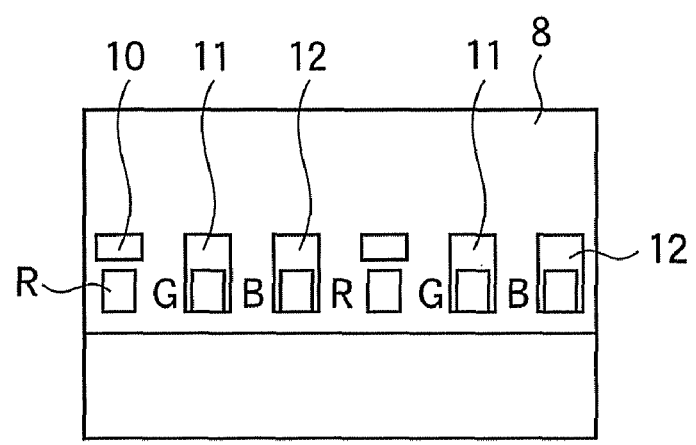

FIGS. 5A and 5B are sectional views and FIG. 5C is a plan view illustrating a fixing process of the green LED portions G. FIGS. 6A and 6B are sectional views and FIG. 6C is a plan view illustrating a fixing process of the blue LED portions B.

First, as shown in FIG. 5A, the sapphire substrate 19 (on which the green LED portions G are formed) is faced with the semiconductor substrate 1 (on which the bonding electrodes 11 and 12 are formed as shown in FIG. 2D). The sapphire substrate 19 is positioned with respect to the semiconductor substrate 1 so that the to-be-bonded electrodes 24 contact the bonding electrodes 11.

Next, the semiconductor substrate 1 and the sapphire substrate 19 are placed in hydrogen atmosphere, and an annealing is performed at the temperature of 300° C., so that the to-be-bonded electrodes 24 of the green LED portions G are fusion-bonded to the bonding electrodes 11. Further, the sapphire substrate 19 is removed by the laser irradiation of an excimer laser. With this, as shown in FIGS. 5B and 5C, the green LED portions G are fixed to the semiconductor substrate 1.

Next, as shown in FIG. 6A, the sapphire substrate 19A is faced with the semiconductor substrate 1 and is positioned as is the case with the sapphire substrate 19. Then, an annealing is performed as described above so that the to-be-bonded electrodes 24 of the blue LED portions B are fusion-bonded to the bonding electrodes 12 on the semiconductor substrate 1. Further, the sapphire substrate 19A is removed by the laser irradiation, with the result that the blue LED portions B are fixed to the semiconductor substrate 1 as shown in FIGS. 6B and 6C.

Referring back to FIGS. 1A through 1C, a large number of bonding pads are provided on the semiconductor substrate 1.

Figure 7:
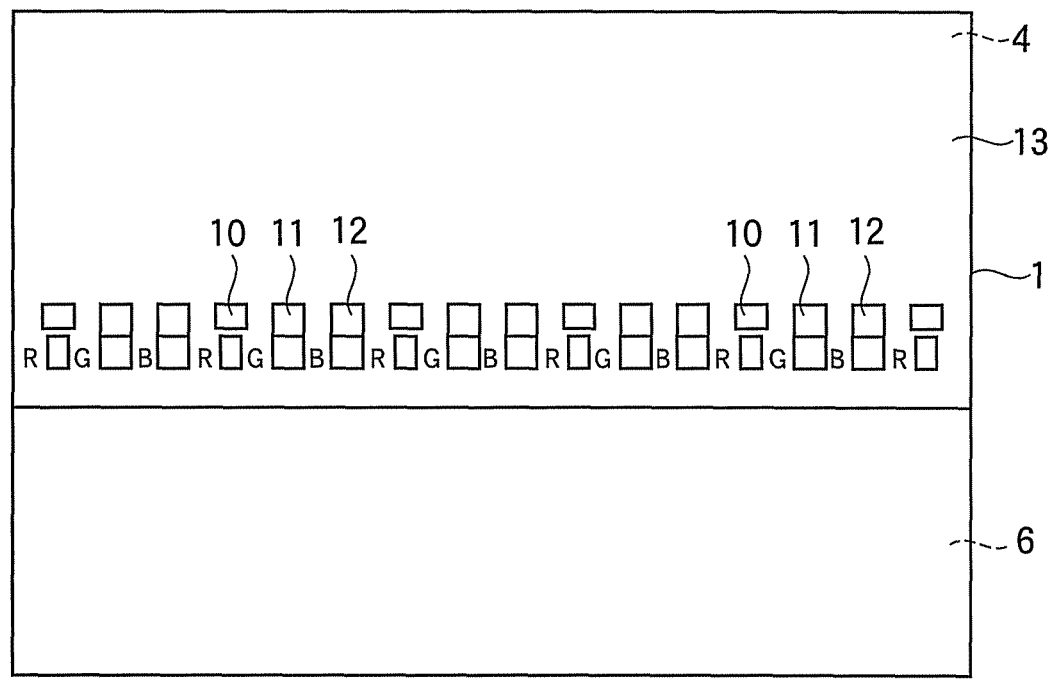
FIG. 7 is a plan view illustrating a process for forming an insulation film according to Embodiment 1.
Figure 8:
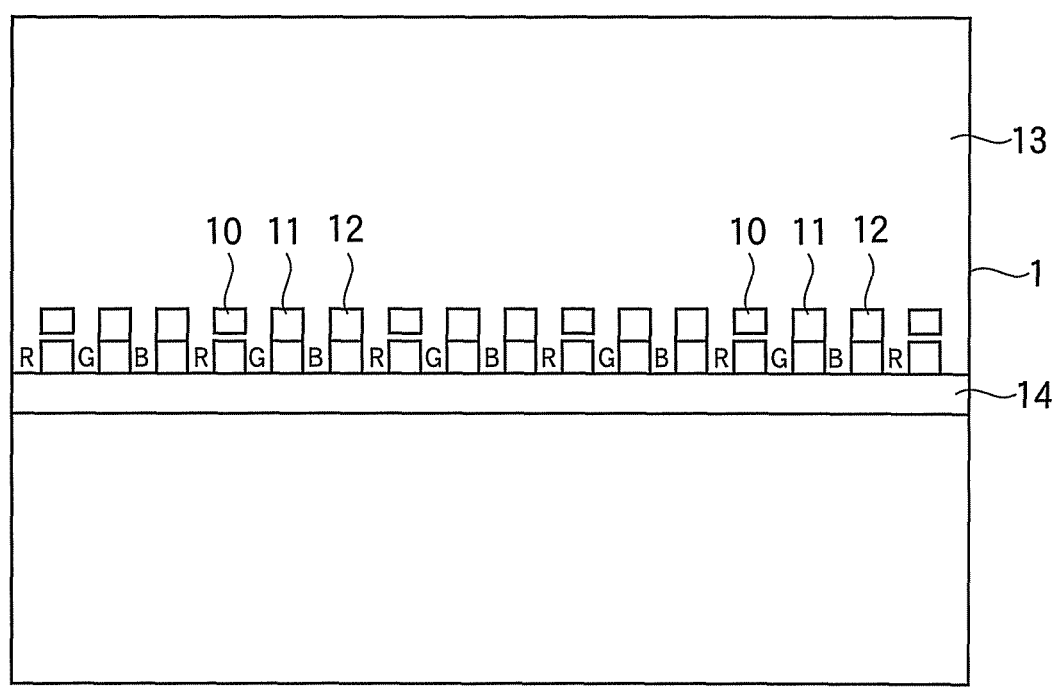
FIG. 8 is a plan view illustrating a process for forming an organic insulating portion according to Embodiment 1.
Figure 9:
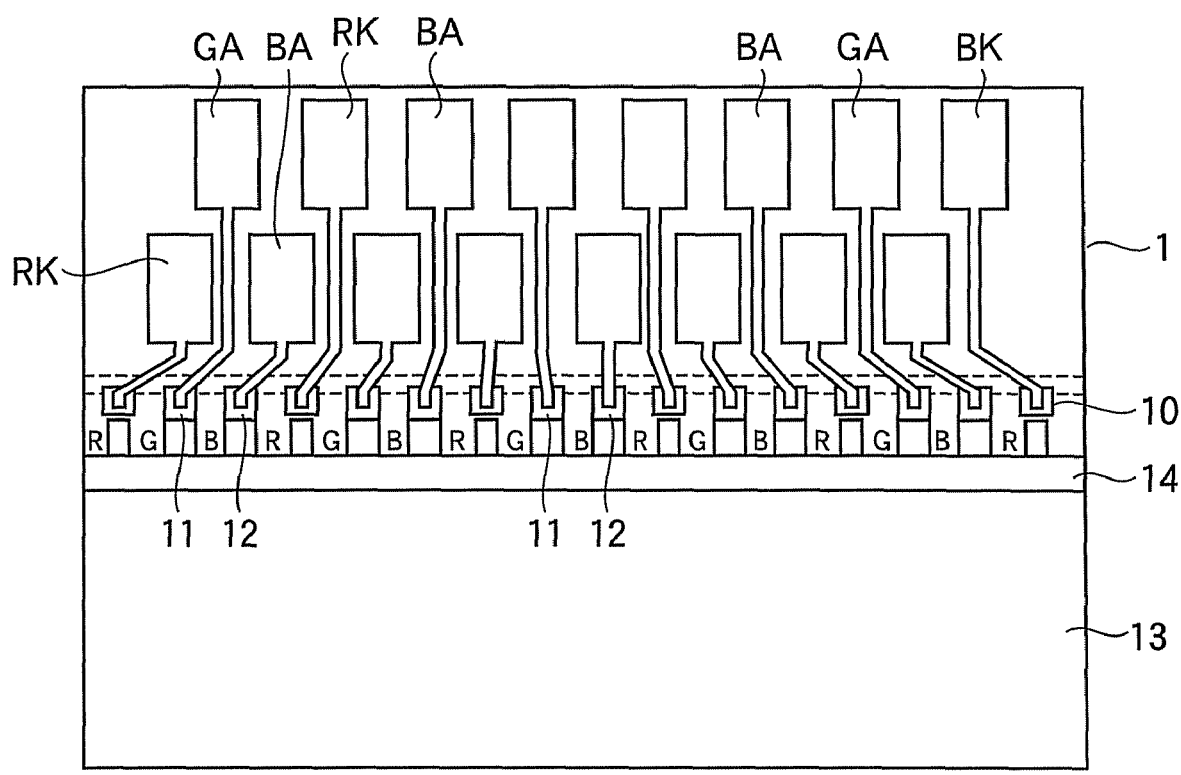
FIG. 9 is a plan view illustrating a process for forming bonding pads according to Embodiment 1.

Here, the forming process of the bonding pads will be described. FIG. 7 is a plan view illustrating a process for forming an insulation film. FIG. 8 is a plan view illustrating a process for forming an organic insulating portion. FIG. 9 is a plan view illustrating a process for forming bonding pads.

First, as shown in FIGS. 1B, 1C and 7, an insulation film 13 is formed on the semiconductor substrate 1 (i.e., on the insulation layer 8) except on the LED portions R, G and B, the contact electrodes 10 and the bonding electrodes 11 and 12. The insulation film 13 is formed of, for example, SiN or $SiO_2$ having the thickness from 200 to 3000 Å (20 to 300 nm) using a photolithography.

Next, in order to prevent the disconnection of wirings due to the existence of a step portion (i.e., due to a difference in height) formed in the etching process of the semiconductor substrate 1, an organic insulating portion 14 (having excellent covering properties) is formed between the step portion and the LED portions R, G and B as shown in FIG. 8 and FIGS. 1A through 1C. The organic insulating portion 14 is formed to the height of the step portion (i.e., to reach the insulation layer 8 on the upper cladding layer 6, from the insulation layer 8 on the lower cladding layer 4 as shown in FIGS. 1B and 1C). The organic insulating portion 14 is formed of an organic material having excellent covering properties such as, for example, polyimide, resist or the like.

Next, as shown in FIG. 9, bonding pads RK on the cathode side of the red LED portions R are formed on the semiconductor substrate 1 so that the bonding pads RK are electrically connected to the contact electrodes 10. Bonding pads GA on the anode side of the green LED portions G are formed on the semiconductor substrate 1 so that the bonding pads GA are electrically connected to the bonding electrodes 11. Bonding pads BA on the anode side of the blue LED portions B are formed on the semiconductor substrate 1 so that the bonding pads BA are electrically connected to the bonding electrodes 12. Each of the bonding pads RK, GA and BA is formed by the deposition of Ti having the thickness from 100 to 1000 Å (10 to 100 nm), Pt having the thickness from 100 to 1000 Å (10 to 100 nm), or Au having the thickness from 1000 to 8000 Å (100 to 800 nm), and by the sintering for enhancing the adherence.

Then, as shown in FIG. 1A, bonding pads RA on the anode side of the red LED portions R are formed on the semiconductor substrate 1 so that the bonding pads RA are electrically connected to the transparent electrodes 7 on the upper surfaces of the red LED portions R. Bonding pads GK on the cathode side of the green LED portions G are formed on the semiconductor substrate 1 so that the bonding pads GK are electrically connected to the n-type cladding layer 21 on the upper surfaces of the bonding pads GK. Bonding pads BK on the cathode side of the blue LED portions B are formed on the semiconductor substrate 1 so that the bonding pads BK are electrically connected to the n-type cladding layer 21 on the upper surfaces of the bonding pads BK. The bonding pads RA, GK and BK are formed by the deposition and the sintering as described above.

In the above configured LED array, the respective bonding pads are connected to terminals by means of not shown bonding wires. The LED array is driven to emit lights by a driving circuit electrically connected to the terminals. When the LED array is incorporated in an LED head, the driving circuit selectively applies drive current (i.e., current in the forward direction) to the LED portions R, G and B according to the image data so as to expose the photosensitive sheet or the like to record an image thereon.

In the LED array of the Embodiment 1, the LED portions G and B are fixed at the same height as the red LED portions R. In particular, the active layers 22 of the LED portions G and B are at the same height as the active layers 5 of the red LED portions R. Therefore, the distances (i.e., exposure distances) from the LED portions R, G and B to the photosensitive sheet of the like can be the same. Accordingly, a sharp image can be obtained.

Figure 10:
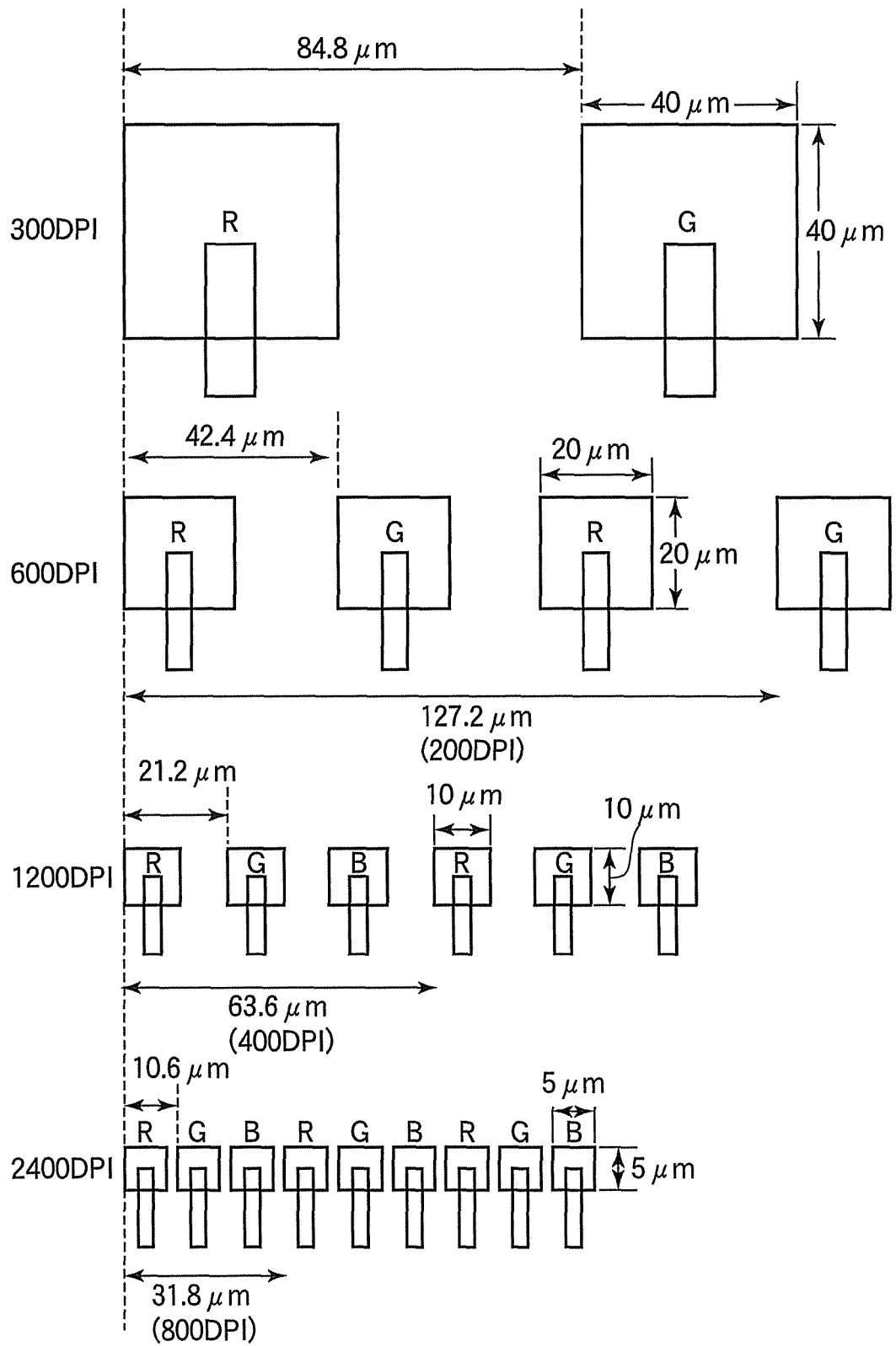
FIG. 10 illustrates a relationship among dimensions, gaps and resolutions of respective LED portions.

FIG. 10 is a schematic view illustrating the relationship among dimensions, gaps and resolutions of the LED portions R, G and B. As shown in FIG. 10, when the LED portions R, G and B are arranged in the main scanning direction to constitute a pixel of 300 dpi, the arrangement pitch of the LED portions is 84.8 µm, and the dimension of each LED portion is 40 µm.

When the LED portions R, G and B are arranged in the main scanning direction to constitute a pixel of 600 dpi, the arrangement pitch of the LED portions is 42.4 µm, and the dimension of each LED portion is 20 µm. When the LED portions R, G and B are arranged in the main scanning direction to constitute a pixel of 1200 dpi, the arrangement pitch of the LED portions is 21.2 µm, and the dimension of each LED portion is 10 µm. When the LED portions R, G and B are arranged in the main scanning direction to constitute a pixel of 2400 dpi, the arrangement pitch of the LED portions is 10.6 µm, and the dimension of each LED portion is 5 µm.

Accordingly, it is understood that the resolution greater than or equal to 300 dpi can be obtained by setting the dimension of each LED portion shorter than or equal to 40 µm.

Modification of Embodiment 1

Figure 11:
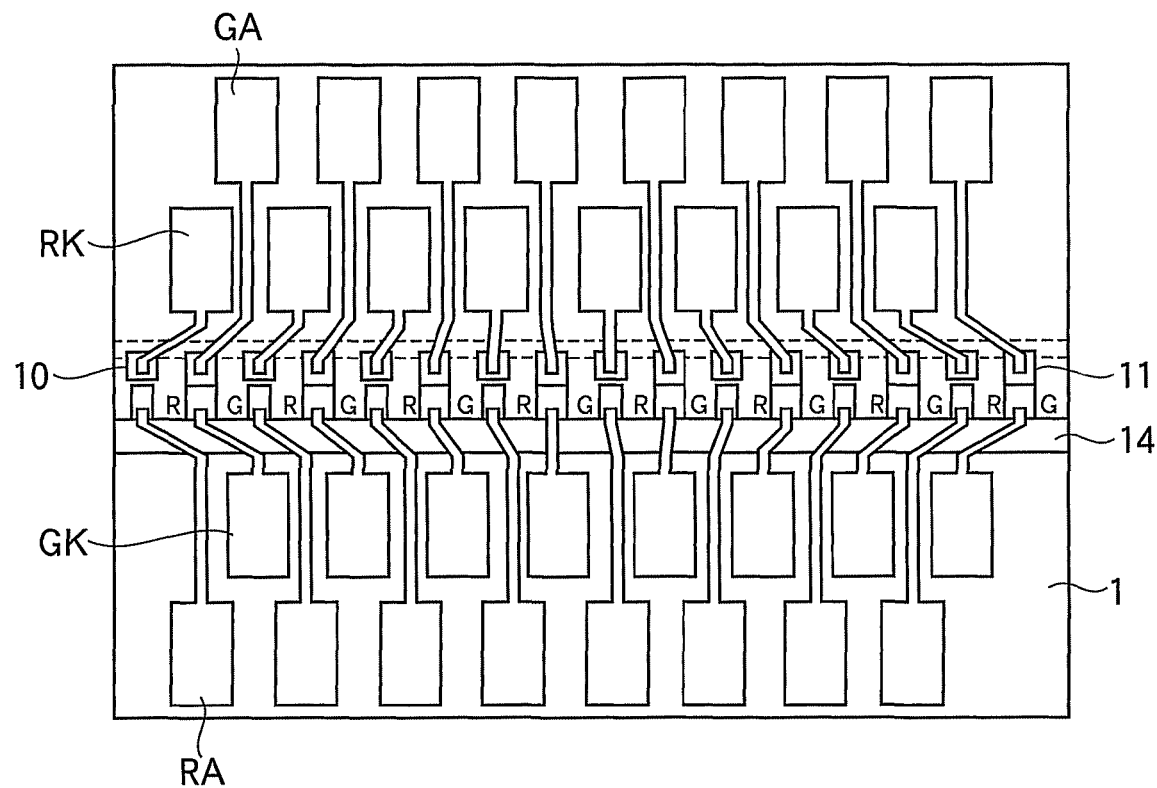
FIG. 11 is a plan view illustrating a modification of the LED array according to Embodiment 1.

FIG. 11 is a plan view illustrating an LED array according to a modification of Embodiment 1. The LED array shown in FIG. 11 has the structure in which the red LED portions R are formed on the semiconductor substrate 1 (by means of an etching process), and the green LED portions G are fixed to the semiconductor substrate 1. In this modification, no blue LED portion B is fixed to the semiconductor substrate 1. Components shown in FIG. 11 that are the same as those of Embodiment 1 are assigned the same reference numerals, and duplicate explanation will be omitted.

The LED array of this modification has the same cross sections as those shown in FIGS. 1B and 1C. The LED array of the modification can be used in an LED head that emits red and green lights, or can be used in an LED head that emits red and green lights and yellow light by combining the red and green lights.

Figure 12A:
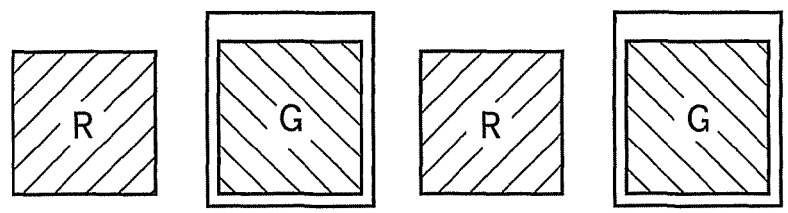
FIGS. 12A and 12B illustrate a relationship between gaps between the LED portions R and G and emitted lights from the LED portions R and G according to the modification of Embodiment 1.
Figure 12B:
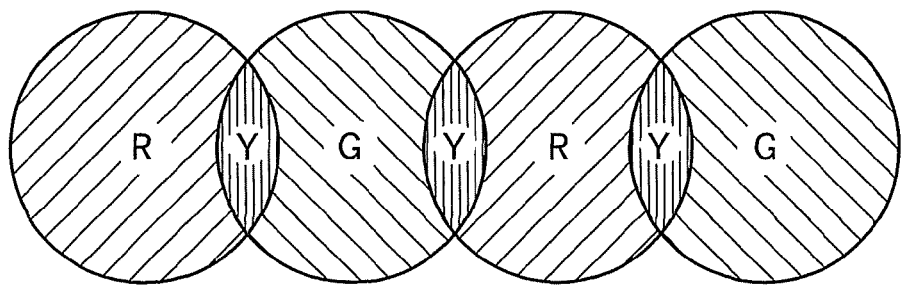
Figure 13A:
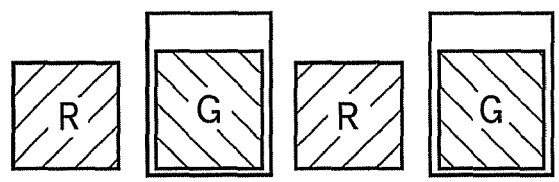
FIGS. 13A and 13B illustrate emitted lights from the LED portions R and G when the LED portions R and G are disposed proximate to each other, according to the modification of Embodiment 1.
Figure 13B:
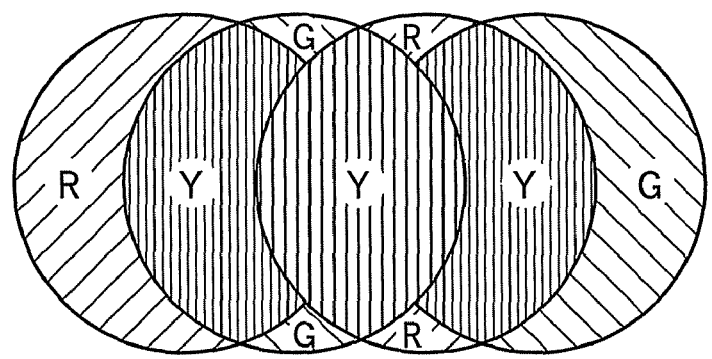

FIG. 12A shows an example of the arrangement of the LED portions R and G, and FIG. 12B shows an example of cross sections of lights emitted by the LED portions R and G. FIG. 13A shows another example of the arrangement of the LED portions R and G, and FIG. 13B shows another example of cross sections of lights emitted by the LED portions R and G.

In the LED array of this modification, when the LED portions R and G are disposed proximate to each other, for example, as shown in FIG. 12A, it becomes possible to obtain yellow light (Y) at portions where red light (R) and green light (G) partially overlap with each other as shown in FIG. 12B. Further, when the LED portions R and G are disposed further proximate to each other, for example, as shown in FIG. 13A, it becomes possible to obtain yellow light (Y) integrated at the center of lights as shown in FIG. 13B.

Figure 14:
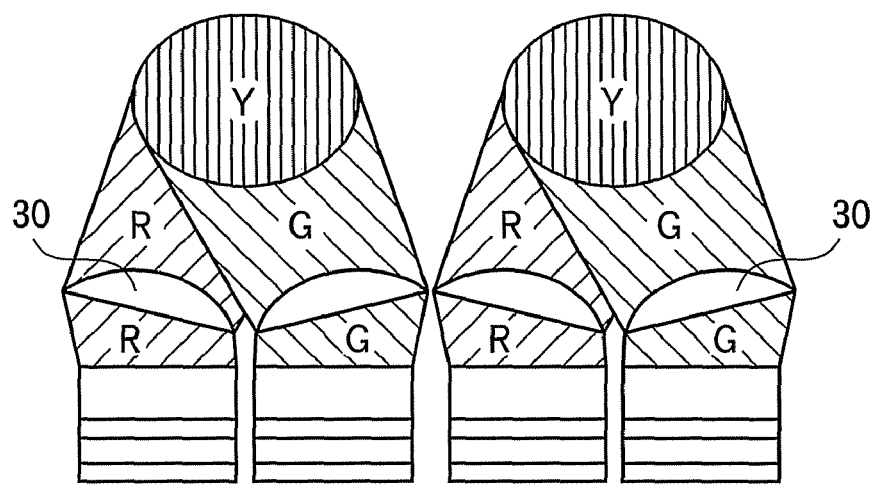
FIG. 14 illustrates emitted lights from the LED portions R and G when lenses are provided to focus lights emitted by the LED portions R and G, according to the modification of Embodiment 1.

FIG. 14 shows an example in which focusing lenses 30 are provided above the LED portions R and G. In the example shown in FIG. 14, red light (R) and green light (G) are accurately combined by the focusing lenses 30 provided above the LED portions R and G, and therefore it becomes possible to obtain clear yellow light (Y).

The LED array of this modification can be manufactured by a method described in Embodiment 1.

Embodiment 2

Figure 15A:
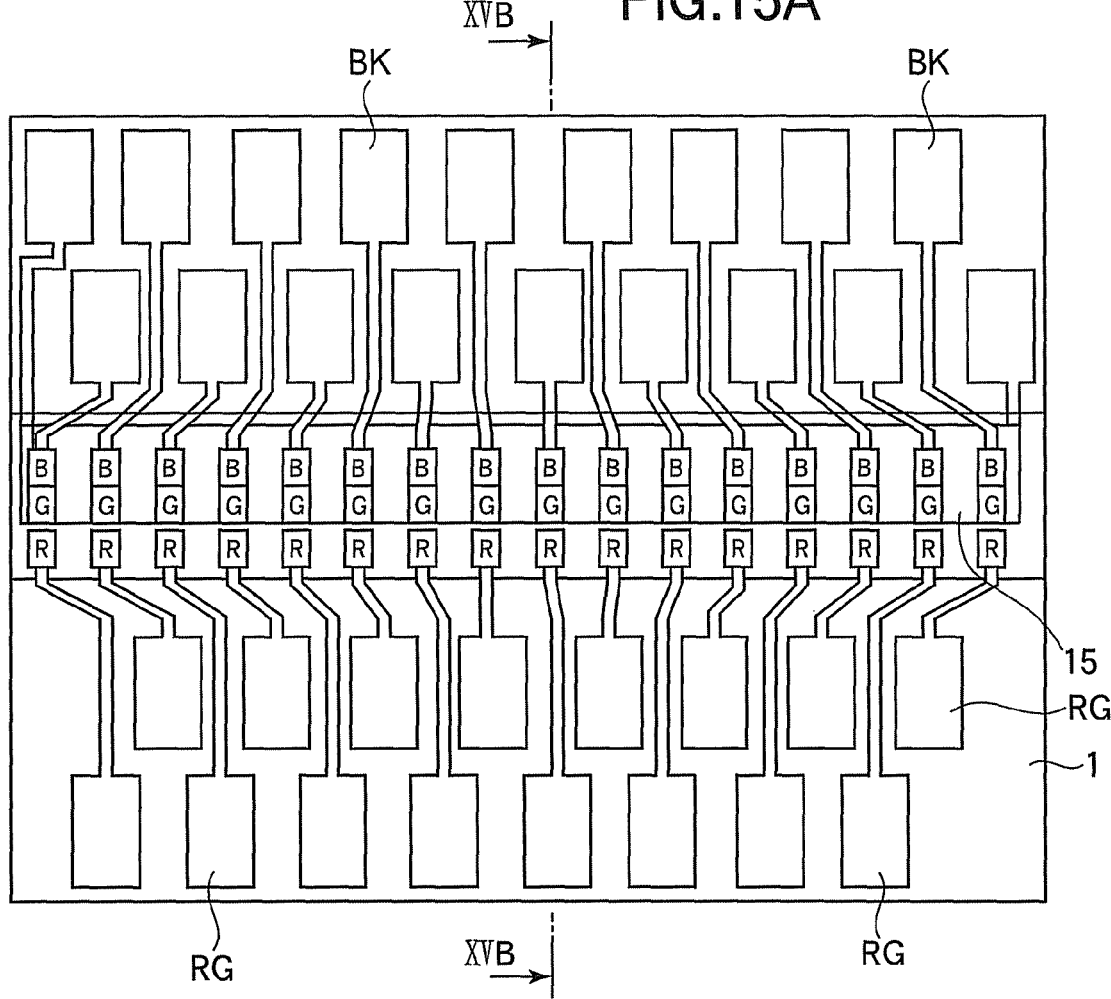
FIG. 15A is a plan view illustrating an LED array according to Embodiment 2 of the present invention.
Figure 15B:
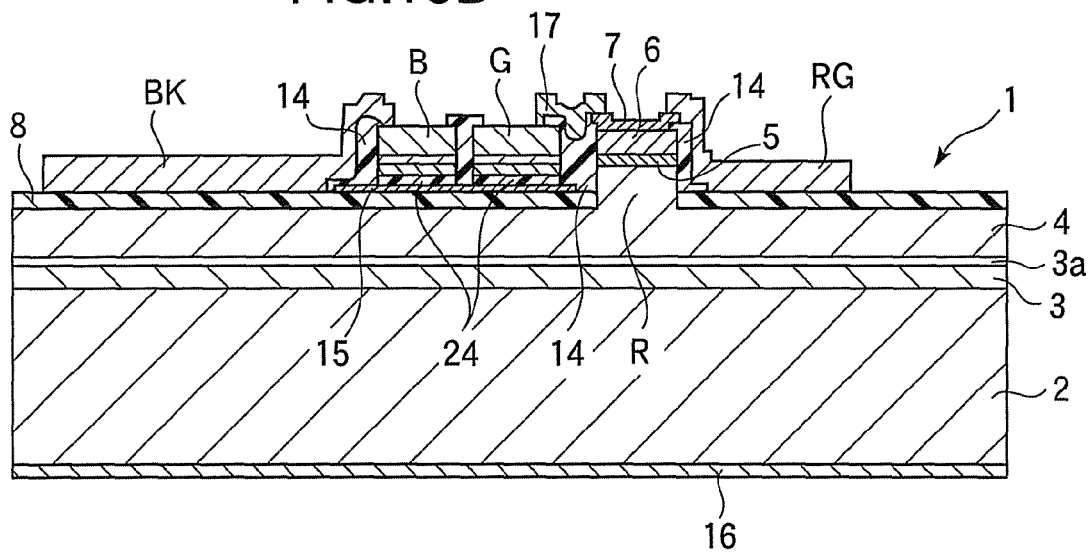
FIG. 15B is a sectional view illustrating the LED array according to Embodiment 2, taken along line XVB-XVB shown in FIG. 15A.

FIG. 15A is a plan view illustrating an LED array according to Embodiment 2 of the present invention. FIG. 15B is a sectional view illustrating the LED array according to Embodiment 2, taken along line XVB-XVB shown in FIG. 15A. In the manufacturing process of the LED array according to Embodiment 2, when the red LED portions R are formed integrally on the semiconductor substrate 1, the semiconductor substrate 1 is etched so as to entirely expose the n-type lower cladding layer 4 (i.e., without forming the step portion). Further, a plate-shaped common bonding anode electrode 15 is formed on the insulation layer 8. The common bonding anode electrode 15 extends along a plurality of red LED portions R arranged in the auxiliary scanning direction.

The green LED portions G and the blue LED portions B are respectively arranged in the auxiliary scanning direction and are fixed to the common bonding anode electrode 15 via the to-be-bonded electrodes 24. In this regard, the LED portions G and B are previously formed on the sapphire substrates as was described in Embodiment 1.

As shown in FIG. 15B, the above described organic insulating portions 14 are formed on the circumferences of the LED portions R, G and B and are filled in the gaps among the LED portions R, G and B. The transparent electrodes 7 of the red LED portions R are electrically connected to common bonding pads RG. A cathode electrode 16 is formed on the bottom of the semiconductor substrate 1. Therefore, when the current flows between the common bonding pads RG (used as the anode side) and the cathode electrode 16 in the forward direction, the red LED portions R are activated to emit red light.

The transparent electrodes 7 and the n-type cladding layers 21 of the upper surfaces of the green LED portions G are electrically connected to each other via conductive connecting portions 17. Accordingly, when the voltage is applied to the common bonding pads RG (used as the cathode side) and the common bonding anode electrode 15 (used as the anode side), the green LED portions G are activated to emit green light.

Bonding pads BK on the cathode side are electrically connected to the n-type cladding layers 21 of the upper surfaces of the blue LED portions B. When the voltage is applied to the anode common electrode 15 and the bonding pads BK, the blue LED portions B are activated to emit blue light.

In Embodiment 2, the LED portions G and B are fixed at the same height as the red LED portions R, and therefore the distances (i.e., the exposure distances) from the LED portions G, B and R to the photosensitive sheet or the like can be the same, as in Embodiment 1. Accordingly, the sharp image can be obtained.

Further, it is not necessary to provide bonding pads on the cathode side connected to the red LED portions R, nor bonding pads on the anode side connected to the LED portions G and B. Therefore, the integration of the multicolor LED portions is enabled.

In this regard, it is also possible to fix the green LED portions G to the semiconductor substrate 1 without fixing the blue LED portions B, as was described in the modification of Embodiment 1.

Embodiment 3

Figure 16:
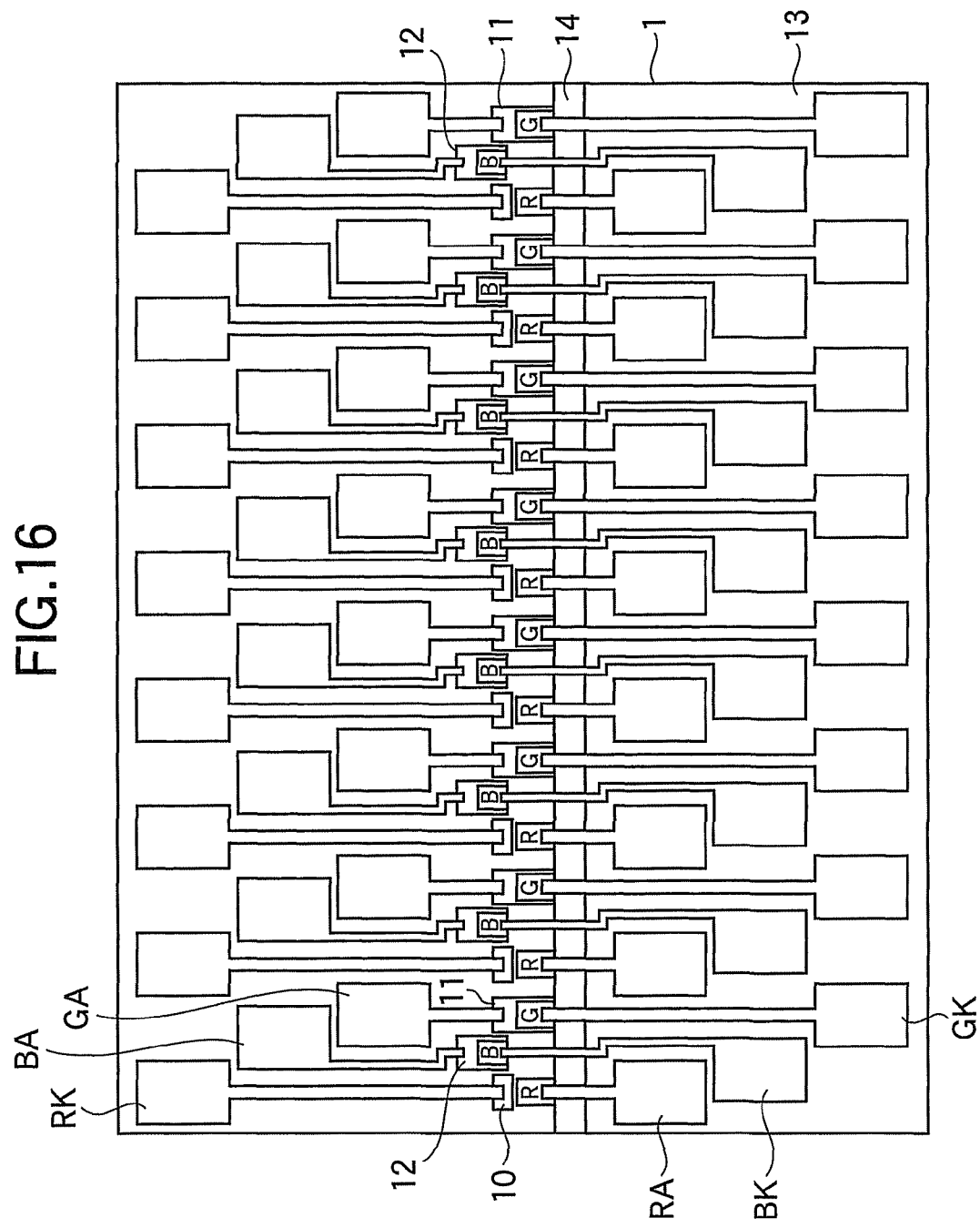
FIG. 16 is a plan view illustrating an LED array according to Embodiment 3 of the present invention.

FIG. 16 is a plan view illustrating an LED array according to Embodiment 3 of the present invention. In Embodiment 3, each blue LED portion B (described in Embodiment 1) is located at a vertex of a triangle formed by the LED portions R, G and B. The other components of Embodiment 3 are the same as those of Embodiment 1, and are assigned the same reference numerals, and duplicate explanation will be omitted.

The LED array of Embodiment 3 can be used in an LED head or a lighting equipment capable of emitting multicolor light.

Figure 17A:
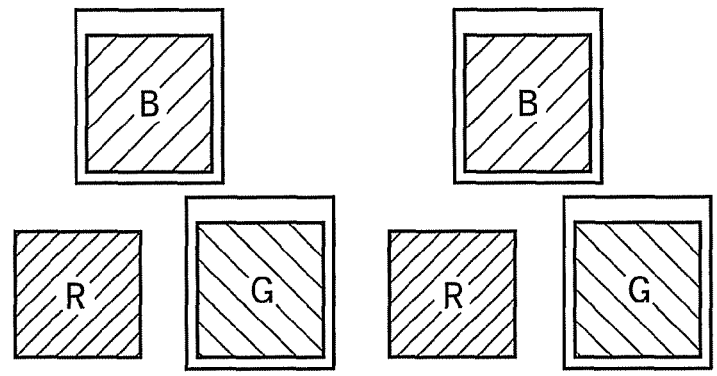
FIGS. 17A and 17B illustrate a relationship between gaps among the LED portions R, G and B and emitted lights, according to Embodiment 3.
Figure 17B:
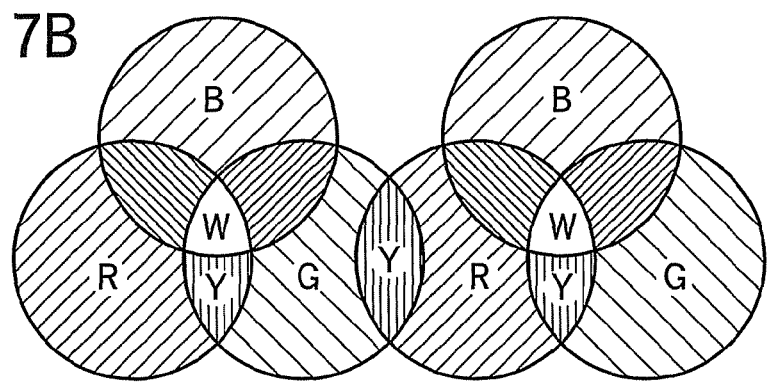

FIG. 17A illustrates an arrangement of the LED portions R, G and B. FIG. 17B illustrates emitted lights from the LED portions R, G and B. By locating the respective LED portions R, G and B at vertexes of a triangle as shown in FIG. 17A, red light and green light partially overlap each other to form yellow light (Y) as shown in FIG. 17B. Further, red light, blue light and green light partially overlap one another to form a white light (W) as shown in FIG. 17B.

Figure 18:
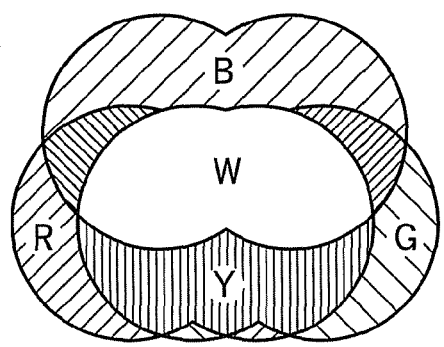
FIG. 18 illustrates emitted lights from the LED portions R, G and B when the LED portions R, G and B are disposed proximate to one another, according to Embodiment 3.

FIG. 18 shows emitted lights from the LED portions R, G and B when the LED portions R, G and B are disposed proximate to one another. By locating the LED portions R, G and B proximate to one another, white light (W) and yellow light (Y) are generated in larger areas.

Figure 19:
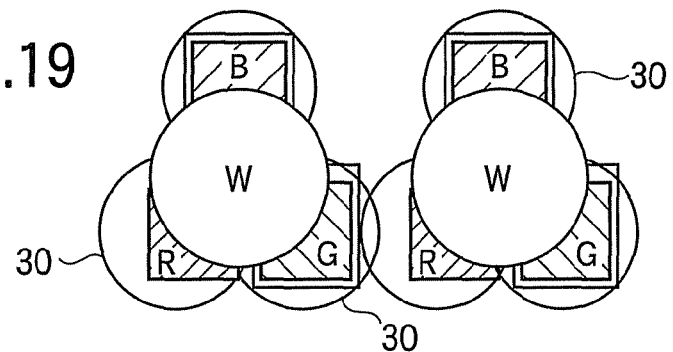
FIG. 19 illustrates emitted lights when lenses are provided to focus lights emitted by the LED portions R, G and B, according to Embodiment 3.

FIG. 19 shows emitted lights from the LED portions R, G and B when focusing lenses 30 are used to focus lights emitted by the LED portions R, G and B. As shown in FIG. 19, red light, green light and blue light are accurately focused on the same focusing position by the focusing lenses 30, and therefore a clear white light (W) can be obtained.

Embodiment 4

FIG. 20A is a plan view illustrating an LED array according to Embodiment 4 of the present invention. FIG. 20B is a sectional view illustrating the LED array of Embodiment 4, taken along line XXB-XXB shown in FIG. 20A.

As shown in FIGS. 20A and 20B, in Embodiment 4, the green LED portions G and the blue LED portions B are layered above the red LED portions R in this order. In other words, starting at the bottom, the red LED portions R, the green LED portions G, and the blue LED portions B are layered and fixed in this order (i.e., in the order in which the band gap increases).

The manufacturing method of the LED array according to Embodiment 4 will be described.

The n-type cladding layer 4, the active layer 5 and the p-type cladding layer 6 are formed on the GaAs substrate 2 via the buffer layer 3 and the p-type semiconductor layer 3a, so that the semiconductor substrate 1 is formed.

Next, the transparent electrode film (7) is coated on the regions on the p-type cladding layer 6 where the red LED portions R are to be formed. Then, an etching process is performed to a depth sufficient to remove the active layer 5 so that the n-type cladding layer 4 is exposed, with the result that the red LED portions R are formed.

Next, an insulation film 41 is formed on the n-type cladding layer 4 except on the red LED portions R. Transparent anode electrodes 40 are formed on the upper surfaces of the red LED portions R. Then, the bonding pads RA (on the anode side) are formed on the insulation film 41 so that the bonding pads RA are electrically connected to the anode electrodes 40.

Next, the bonding pads RA are masked, and then an insulation film 42 (having optical transparency) is formed on the insulation film 41 and on the circumferences of the red LED portions R.

Then, the bonding electrodes 11 are formed on the upper surfaces of the red LED portions R via the insulation film 42.

The green LED portions G and the blue LED portions B are formed on the respective sapphire substrates as was described in Embodiment 1.

Next, the sapphire substrate 19 (see FIG. 5A) is faced with the semiconductor substrate 1, and is positioned in such a manner that the to-be-bonded electrodes 24 contact bonding electrodes 11 as described in Embodiment 1. Then, the sapphire substrate 19 is removed, with the result that the green LED portions G are fixed above the red LED portions R.

Next, cathode electrodes 44 are formed on the green LED portions G, and the bonding pads GA (on the anode side) are formed on the insulation film 42 so that the bonding pads GA are electrically connected to the bonding electrodes 11.

Then, the bonding pads RA and GA are masked, and another insulation film 43 (having optical transparency) is formed to cover the insulation film 42 and the circumferences of the green LED portions G.

Next, the bonding electrodes 12 are formed on the upper surface of the green LED portions G via the insulation film 43.

Then, the sapphire substrate 19A (on which the blue LED portions B are formed as shown in FIG. 6A) is faced with the semiconductor substrate 1, and is positioned in such a manner that the to-be-bonded electrodes 24 of the blue LED portions B contact the bonding electrodes 12. Then, the to-be-bonded electrodes 24 are fixed to the bonding electrodes 12 as described above, and the sapphire substrate 19A is removed. As a result, the blue LED portions B are fixed above the Led portions G.

Next, the bonding pads GK on the cathode side are formed on the insulation film 43 so that the bonding pads GK are electrically connected to the cathode electrodes 44, and bonding pads BA on the anode side are formed on the insulation film 43 so that the bonding pads BA are electrically connected to the bonding electrodes 12.

Next, cathode electrodes 46 are formed on the upper surfaces of the blue LED portions B. Then, an insulation film 45 (having optical transparency) is formed to cover the insulation film 43 and the circumferences of the blue LED portion B. Further, the bonding pads BK on the cathode side are formed on the insulation film 45 so that the bonding pads BK are electrically connected to the cathode electrodes 46.

Next, the cathode electrode 16 for the red LED portions R is formed on the lower surface of the semiconductor substrate 1.

In the LED array of Embodiment 4 manufactured as above, when current flows in the forward direction between the cathode electrode 16 and the bonding pads RA, the red LED portions R are activated to emit red light. When current flows in the forward direction between the bonding pads GA and the bonding pads GK, the green LED portions G are activated to emit green light. When current flows in the forward direction between the bonding pads BA and the bonding pads BK, the blue LED portions B are activated to emit blue light.

In this Embodiment 4, red light (emitted by the red LED portions R) is emitted to the outside through the green LED portions G and the blue LED portions B, and green light (emitted by the green LED portions G) is emitted to the outside through the blue LED portions B. By activating the LED portions R, G and B at the same time, white light is emitted. By selectively activating the LED portions R, G and B in combination, a desired colored light (such as yellow light, aqua colored light or the like) is emitted.

Embodiment 5

Figure 21:
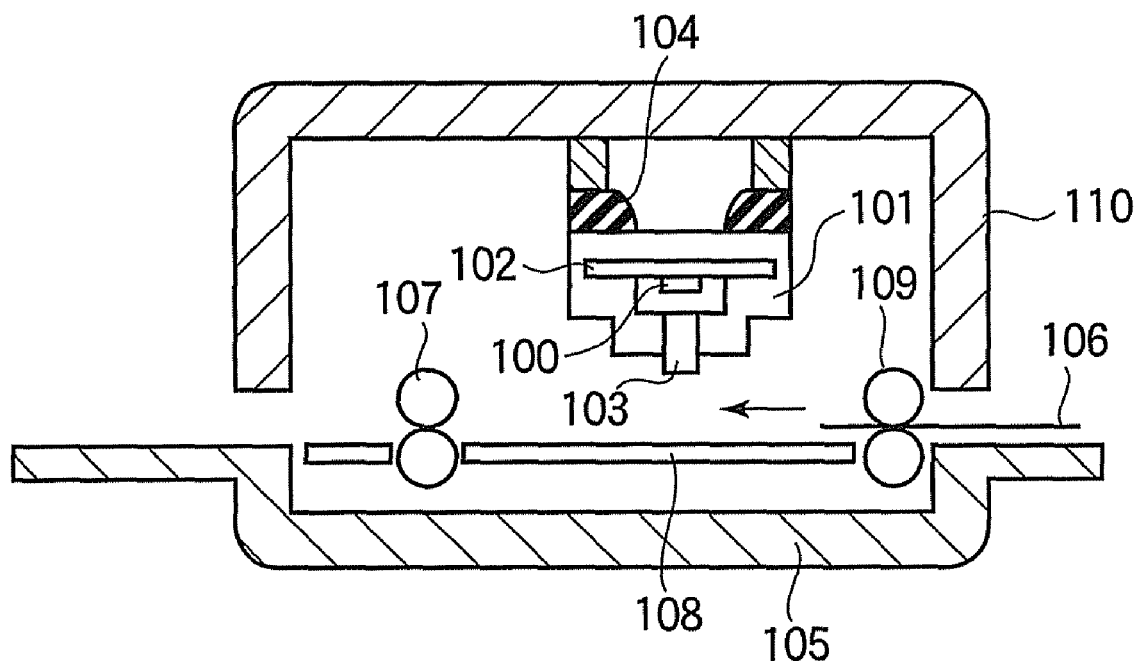
FIG. 21 is a schematic sectional view illustrating an image recording apparatus according to Embodiments of the present invention.

FIG. 21 is a sectional view illustrating an image recording apparatus according to Embodiment 5, in which the LED array 100 according to Embodiment 1 is incorporated. The image recording apparatus includes an LED head 101. The LED head 101 includes the LED array 100, a print circuit board 102 on which the LED array 100 is mounted and a rod lens array 103. The LED head 101 is detachably attached to a casing 110 via a resilient body 104. A driving circuit is mounted on the print circuit board 102, and the driving circuit drives the LED array 100.

A sheet supply tray 105 is attached to the lower part of the casing 110. The sheet supply tray 105 includes rollers 107 and 109 that feed the photosensitive sheet 106, a feeding path 108 along which the photosensitive sheet 106 is fed, or the like.

When a memory card (not shown) storing image data is inserted into the image recording apparatus, a card reading portion (not shown) reads the image date and sends the image data to the driving circuit. The driving circuit drives the LED array 100 based on the image data, and lights of the respective colors are emitted by the LED array 100 via the rod lens array 103. Therefore, an image is formed on the photosensitive sheet 106 while the photosensitive sheet 106 is fed along the feeding path 108

In the above description, the image recording apparatus employs the LED array of Embodiment 1. However, it is also possible that the image recording apparatus employs the LED array of Embodiment 2, 3 or 4.

While the preferred embodiments of the present invention have been illustrated in detail, it should be apparent that modifications and improvements may be made to the invention without departing from the spirit and scope of the invention as described in the following claims.

What is claimed is:

1. An LED array comprising:
   a semiconductor substrate;
   a plurality of first LED portions formed integrally on a surface of said semiconductor substrate with no insulation layer interposed between the semiconductor substrate and the first LED portions, said first LED portions emitting light of a predetermined color, and
   a plurality of second LED portions fixed to said semiconductor substrate with at least an insulation layer interposed therebetween, said second LED portions being disposed corresponding to said first LED portions, and emitting light whose color is different from said first LED portions,
   wherein said second LED portions are so disposed that active layers of said second LED portions are substantially at the same height as active layers of said first LED portions.

2. The LED array according to claim 1, wherein said second LED portions are fixed to regions of said semiconductor substrate which are different in height from regions of said semiconductor substrate on which said first LED portions are integrally formed.

3. The LED array according to claim 1, wherein said first LED portions include red LED portions, and said second LED portions include at least one of green LED portions and blue LED portions.

4. The LED array according to claim 1, wherein said first LED portions and second LED portions are substantially linearly arranged.

5. The LED array according to claim 1, wherein said first LED portions include red LED portions, and said second LED portions include green LED portions and blue LED portions, and
   wherein said red LED portion, said blue LED portion and said green LED portion are disposed on vertexes of a triangle.

6. The LED array according to claim 1, wherein said semiconductor substrate has an insulation film formed on a surface thereof and bonding electrodes provided on said insulation film,
   wherein said second LED portions have electrodes formed on a surface thereof, and
   wherein said second LED portions are fixed to said semiconductor substrate in such a manner that said electrodes of said second LED portions contact said bonding electrodes of said semiconductor substrate.

7. The LED array according to claim 6, further comprising bonding pads electrically connected to said bonding electrodes, and other bonding pads electrically connected to transparent electrodes formed on upper surfaces of said second LED portions.

8. The LED array according to claim 1, further comprising a plurality of bonding pads formed on said semiconductor substrate, which are electrically connected to anode side electrodes and cathode side electrodes of said first LED portions and said second LED portions.

9. An LED head comprising:
   an LED array according to claim 1, and
   a driving circuit that controls said first LED portions and said second LED portions in accordance with image data.

10. An image recording apparatus comprising:
    an LED head according to claim 9, and
    a feeding portion that feeds a photosensitive material in an auxiliary scanning direction, said photosensitive material being exposed with lights of respective colors emitted by said LED head.

11. The LED array of claim 1, wherein said first LED portions and said second LED portions are respectively disposed on a first part and a second part of the semiconductor substrate, the first and second parts of the semiconductor substrate being composed of a same material.

* * * * *